(12) United States Patent
Kong et al.

(10) Patent No.: US 9,704,833 B2
(45) Date of Patent: Jul. 11, 2017

(54) FULL-COLOR LIGHT EMITTING DIODE (LED) DISPLAY PANEL, METHOD OF MANUFACTURING FULL-COLOR LED DISPLAY PANEL, DISPLAY DEVICE

(71) Applicant: BOE TECHNOLOGY GROUP CO., LTD., Beijing (CN)

(72) Inventors: Xiangchun Kong, Beijing (CN); Zhanfeng Cao, Beijing (CN); Qi Yao, Beijing (CN); Luke Ding, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 177 days.

(21) Appl. No.: 14/403,467

(22) PCT Filed: Mar. 20, 2014

(86) PCT No.: PCT/CN2014/073773
§ 371 (c)(1),
(2) Date: Nov. 24, 2014

(87) PCT Pub. No.: WO2015/123907
PCT Pub. Date: Aug. 27, 2015

(65) Prior Publication Data
US 2016/0284673 A1    Sep. 29, 2016

(30) Foreign Application Priority Data
Feb. 19, 2014    (CN) .......................... 2014 1 0056581

(51) Int. Cl.
*H01L 33/50*    (2010.01)
*H01L 27/32*    (2006.01)
(Continued)

(52) U.S. Cl.
CPC .... *H01L 25/0753* (2013.01); *H01L 27/14621* (2013.01); *H01L 27/153* (2013.01);
(Continued)

(58) Field of Classification Search
CPC . H01L 25/0753; H01L 27/153; H01L 27/156; H01L 27/3281; H01L 27/3283;
(Continued)

(56) References Cited

U.S. PATENT DOCUMENTS

| 5,313,078 A * | 5/1994 | Fujii .................. H01L 33/0008 257/101 |
| 6,987,355 B2 * | 1/2006 | Cok ..................... G09G 3/3216 257/100 |

(Continued)

FOREIGN PATENT DOCUMENTS

| CN | 1780018 A | 5/2006 |
| CN | 1967900 A | 5/2007 |

(Continued)

OTHER PUBLICATIONS

Chinese Office Action dated Jan. 7, 2015 regarding Application No. 201410056581.0, filed Feb. 19, 2014. Translation provided by Dragon Intellectual Property Law Firm.

(Continued)

*Primary Examiner* — Galina Yushina
(74) *Attorney, Agent, or Firm* — Harness, Dickey & Pierce, P.L.C.

(57) ABSTRACT

A full-color display panel includes a plurality of sub-pixel units. The sub-pixel unit includes an LED unit and a filter layer transmitting light of a specific color. The LED unit includes an LED semiconductor chip emitting light of a specific color. The LED semiconductor chips of the plurality of sub-pixel units are homochromatic LED semiconductor chips emitting light of a same color. In each sub-pixel unit, a position of the filter layer corresponds to a position of the LED semiconductor chip, and the filter layer is located on a side of the LED semiconductor chip that emits light.

16 Claims, 4 Drawing Sheets

(51) Int. Cl.
*H01L 27/146* (2006.01)
*H01L 25/075* (2006.01)
*H01L 27/15* (2006.01)
*H01L 33/56* (2010.01)

(52) U.S. Cl.
CPC ........ *H01L 27/156* (2013.01); *H01L 27/3241* (2013.01); *H01L 33/502* (2013.01); *H01L 33/50* (2013.01); *H01L 33/56* (2013.01)

(58) Field of Classification Search
CPC ................ H01L 27/3241; H01L 27/15; H01L 27/14621; H01L 25/07; H01L 33/50; H01L 33/502; H01L 33/56; H01L 33/00; H01L 33/52
See application file for complete search history.

(56) References Cited

U.S. PATENT DOCUMENTS

| | | | | |
|---|---|---|---|---|
| 2008/0074583 | A1* | 3/2008 | Li | G02F 1/133617 349/71 |
| 2008/0284316 | A1* | 11/2008 | Kurihara | H05B 33/145 313/503 |
| 2011/0198629 | A1* | 8/2011 | Lee | H01L 27/3213 257/89 |
| 2012/0087108 | A1* | 4/2012 | Ke | H01L 25/0753 362/97.1 |
| 2014/0118411 | A1* | 5/2014 | Jang | G09G 3/3208 345/690 |

FOREIGN PATENT DOCUMENTS

| | | |
|---|---|---|
| CN | 102214651 A | 10/2011 |
| EP | 1818695 A1 | 8/2007 |
| JP | 2004184737 A | 7/2004 |

OTHER PUBLICATIONS

Second Office Action regarding Chinese application No. 201410056581.0, dated Jul. 1, 2015. Translation provided by Dragon Intellectual Property Law Firm.

Written Comments of the International Searching Authority for international application No. PCT/CN2014/073773.

* cited by examiner

FULL-COLOR LIGHT EMITTING DIODE
(LED) DISPLAY PANEL, METHOD OF
MANUFACTURING FULL-COLOR LED
DISPLAY PANEL, DISPLAY DEVICE

CROSS-REFERENCE TO RELATED APPLICATION

This application is the U.S. national phase of PCT Application No. PCT/CN2014/073773 filed on Mar. 20, 2014, which claims priority to Chinese Patent Application No. 201410056581.0 filed on Feb. 19, 2014, the disclosures of which are incorporated in their entirety by reference herein.

TECHNICAL FIELD

The present disclosure generally relates to the field of LED display technology and, more particularly, relates to a full-color LED display panel, a method of manufacturing the full-color display panel, a display device, and an electronic product.

BACKGROUND

LED display devices have many advantages of pure colors, wide dynamic range, high brightness, high definition, low voltage, low power consumption, long life, impact resistance, wide viewable angle, stability, and reliability. LED display devices have become a new generation of display media and have been used widely.

A display unit of a LED display device includes an LED array and a driving circuit. The main structure of LED is a solid semiconductor chip that may convert electrical energy into visible light. The LED is packaged by a transparent epoxy resin. The LED semiconductor chip includes two parts. One part is a P-type semiconductor dominated by holes inside. The other part is an N-type semiconductor composed mainly of electrons inside. When the P-type semiconductor and the N-type semiconductor are connected, a P-N junction is formed between the P-type semiconductor and the N-type semiconductor. When an electric field is applied between the P-type semiconductor and the N-type semiconductor, electrons in the N-type semiconductor are pushed to the P-type semiconductor, recombined with the holes in the P-type semiconductor, and release energy in the form of photon. This is the light-emitting mechanism of LED. The wavelength of the light emitted from the LED, that is the color of the light, is determined by the material of P-N junction. In Practice, one end of the LED semiconductor chip is attached to a bracket. One end of the LED semiconductor chip is a cathode, and the other end that is connected with a power supply is an anode. Full-color LED display device applies voltages to two ends of the LED semiconductor chip through the driving circuit, controls the on-off state and the brightness of LEDs of multiple colors (generally including red LEDs, green LEDs and blue LEDs), so as to display color pictures.

However, for full-color LED display devices, because the light-emitting units of LEDs of different colors are doped with different composition materials, the process cycle is prolonged, the production costs are raised, and the defect rate of products is increased. In addition, because the drivers and sizes of LEDs of different colors are different, the cell thickness of the LED display panel and the production costs are largely raised. This is on the contrary of the market needs to reduce the thickness and cost of display devices. Thus, the application of LED display device is limited significantly.

SUMMARY (A) Technical Problems to be Solved

The present disclosure provides a full-color LED display panel, and a method of manufacturing the full-color LED display panel, so as to resolve the problems of thick cell, high production costs, and high defect rate in the production of full-color LED display panel.

The present disclosure also provides a display device, and an electronic product including the display device. By applying the full-color LED display panel into the display device and the electronic product, the thickness of the cell is reduced, the production cost is reduced, the defect rate of the product is reduced.

(B) The Technical Solutions

The present disclosure provides technical solutions as following.

The present disclosure provides a full-color LED display panel including a substrate and a plurality of sub-pixel units distributed on the substrate. The sub-pixel unit includes an LED unit and a filter layer transmitting light of a specific color. The LED unit includes an LED semiconductor chip emitting light of a specific color.

The LED semiconductor chips corresponding to each sub-pixel unit of the plurality of sub-pixel units are homochromatic LED semiconductor chips emitting light of a same color.

In each sub-pixel unit, a position of the filter layer corresponds to a position of the LED semiconductor chip, and the filter layer is located on a side of the LED semiconductor chip that emits light.

The present disclosure also provides a display device including a full-color display panel as described above.

The present disclosure also provides a method of manufacturing a full-color LED display panel as described below.

A substrate is provided.

LED units of a plurality of sub-pixel units are formed on the substrate simultaneously. The LED unit includes an LED semiconductor chip emitting light of a specific color. The LED semiconductor chips corresponding to each sub-pixel unit of the plurality of sub-pixel units are homochromatic LED semiconductor chips emitting light of a same color.

A filter layer of the plurality of sub-pixel units is formed on the substrate. In each sub-pixel unit, the filter layer transmits light of a specific color. The filter layer is located in a position corresponding to the LED semiconductor chip. The filter layer is located on a side of the LED semiconductor chip that emits light.

The present disclosure also provides an electronic product including a full-color display device as described above.

(C) The Beneficial Effects

In present disclosure, the LED semiconductor chips of the full-color LED display panel are homochromatic semiconductor chips, and a filter layer transmitting light of a specific color is formed on a side of each LED semiconductor chip that emits light. Because the processes of producing homochromatic semiconductor chips are the same, all the homochromatic semiconductor chips may be formed at the same time, such that the processing cycle is shortened, the production cost is reduced, and the defect rate of products is reduced. In addition, because the homochromatic LED semiconductor chips have the same drivers and the sizes, the cell thickness of the display panel and the production costs are reduced. In addition, by applying filter layers transmitting light of different colors, the multi-color sub-pixel units are generated to achieve full-color display.

BRIEF DESCRIPTION OF THE DRAWINGS

In order to illustrate the embodiments of the present invention or the technical solutions in the prior art in a clearer manner, the drawings of the embodiments will be described briefly hereinafter. Obviously, the following drawings merely relate to a part of the embodiments of the present invention, and a person skilled in the art, without any creative effort, may obtain the other drawings based thereon.

DETAILED DESCRIPTION

In current technology, the displaying of color pictures is achieved by controlling the on-off state and the brightness of LEDs of multiple colors. Because the production processes of LEDs of different colors are different, each LED needs to be processed independently, resulting in a prolonged process cycle, raised production costs, and an increased defect rate of products. In addition, because LEDs of different colors have different drivers and sizes, the cell thickness of the LED display panel and the production costs are raised.

In order to solve the technical problem, the present disclosure designs LED semiconductor chips of the full-color LED display panel as homochromatic semiconductor chips, and a filter layer corresponding to each LED semiconductor chip and transmitting light of a specific color is formed on a side of each LED semiconductor chip that emits light. Because the processes of producing homochromatic semiconductor chips are the same, all the homochromatic semiconductor chips may be formed at the same time, such that the processing cycle is shortened, the production costs are reduced, and the defect rate of products is reduced. In addition, because homochromatic LED semiconductor chips have the same drivers and sizes, the cell thickness of the display panel and the production costs are reduced. In addition, by applying filter layers transmitting light of different colors, the multi-color sub-pixel units are generated to achieve full-color display.

In conjunction with the corresponding figures and embodiments, specific embodiments of the present disclosure are described below. The following embodiments are used for illustration purpose, but are not intended to limit the scope of the present disclosure.

Embodiment One

Figure 1:
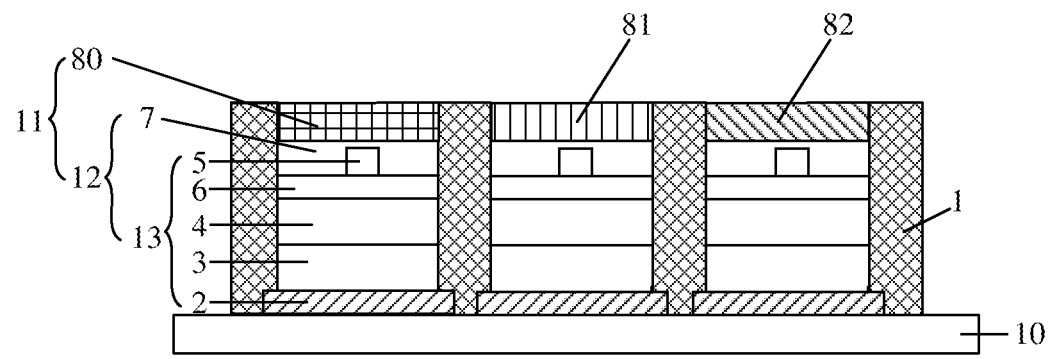
FIG. 1 is a schematic diagram showing a structure of a full-color LED display panel according to an embodiment of the present disclosure.

FIG. 1 is a schematic diagram showing a structure of a full-color LED display panel according to an embodiment of the present disclosure. As shown in FIG. 1, the present disclosure provides a full-color LED display panel including a substrate 10 and a plurality of sub-pixel units 11 arranged on the substrate 10. The sub-pixel unit 11 includes an LED unit 12 and a filter layer transmitting light of a specific color (such as a red filter layer 80, a green filter layer 81, and a blue filter layer 82, but not limited to filter layers of these three colors). The LED unit includes an LED semiconductor chip emitting light of a specific color 13.

The LED semiconductor chips 13 of a plurality of sub-pixel units 11 are homochromatic LED semiconductor chips emitting light of a same color.

In each sub-pixel unit 11, a position of the filter layer corresponds to a position of the LED semiconductor chip 13, and the filter layer is located on a side of the LED semiconductor chip 13 that emits light.

In above technical solution, the LED semiconductor chips of the full-color LED display panel are homochromatic semiconductor chips, and a filter layer transmitting light of a specific color is formed on a side of the LED semiconductor chip that emits light. Because the processes of producing homochromatic semiconductor chips are the same, all the homochromatic semiconductor chips may be formed at the same time, such that the processing cycle is shortened, the production costs are reduced, and the defect rate of products is reduced. In addition, because the homochromatic LED semiconductor chips have the same drivers and sizes, the cell thickness of the display panel and the production costs are reduced. In addition, by applying filter layers transmitting light of different colors, the multi-color sub-pixel units are generated to achieve full-color display.

The LED semiconductor chip 13 is a light-emitting unit of the LED unit 12. The filter layer may be an epoxy resin layer containing a primary color material, but not limited in that.

In a specific embodiment, the light emitted by the LED units 12 of a plurality of sub-pixel units 11 may all be white light. In order to achieve color display, the filter layers may include a red filter layer 80, a green filter layer 81, and a blue filter layer 82. Specifically, the blue LED semiconductor chip 13 and yellow phosphors may cooperate to achieve a white LED unit 12. In the present embodiment, the yellow phosphors may be doped into transparent epoxy resin, so as to provide a carrier for the yellow phosphors for the convenience of processing. Thus, each LED unit 12 may also include an epoxy resin layer 7 containing phosphors. And the epoxy resin layers containing phosphors of a plurality of LED units 12 may be formed at the same time to simplify the processing.

Optionally, the light emitted by LED unit 12 may be other colors, as long as color display may be achieved by the cooperation of LED semiconductor chip 13, phosphors, and the filter layer.

In current technology, the LED unit 12 is packaged by transparent epoxy resin layer. In order to prevent color mix among LED units 12, a large distance needs to be ensured among LED units 12, which results an increase of the volume of LED display panel.

In the present embodiment, opaque pixel separating parts 1 are used to separate a plurality of sub-pixel regions of different colors. The sub-pixel units 11 are located in sub-pixel regions of corresponding colors. The pixel separating part 1 may be a pixel separating wall. In a direction that the LED semiconductor chip 13 emits light, a height of the pixel separating part 1 is not less than a height of the filter layer. The LED semiconductor chip 13 is defined to emit light only from the top of the LED unit 12 and pass through the filter layer. Thus LED unit 12 may be packaged by corresponding pixel separating part 1 and filter layer. Because pixel separating 1 is opaque, the light emitted by the LED semiconductor chip 13 may only be emitted from the top of the LED unit 12 and pass through the filter layer. Thus the light mix among adjacent LED units 12 may be prevented effectively, so as to reduce the distance among LED units 12, and to reduce the volume of LED display panel.

A red sub-pixel unit is used as an example to illustrate the structure of a sub-pixel unit of an LED display panel specifically.

The sub-pixel unit includes: a blue LED semiconductor chip 13 located on a substrate 10; an epoxy resin layer 7 containing yellow phosphors and located on the blue LED semiconductor chip; a red filter layer 80 located on the epoxy resin layer 7 containing yellow phosphors.

The blue LED semiconductor chip 13, the epoxy resin layer 7 containing yellow phosphors, and the red filter layer 80 are all located in a red sub-pixel region separated by the pixel separating part 1. The height of the top of the pixel separating part 1 is not less than the height of the top of the red filter layer 80.

In one embodiment of the present disclosure, the blue LED semiconductor chip 13, the epoxy resin layer 7 containing yellow phosphors, and the red filter layer 80 form the structure of a sub-pixel unit. This above structure is only for illustration purpose, as long as an expected sub-pixel unit may be formed, other types of suitable materials may be used, such as phosphors of other colors.

Specifically, the LED semiconductor chip includes:

a first electrode 2 formed on a substrate 10;

an base 3, such as a sapphire base, a silicon carbide base, or a silicon base, formed above the first electrode 2;

an N-type semiconductor 4 formed above the base 3;

a P-type semiconductor 6 formed above the N-type semiconductor 4; and a second electrode 5 formed above the P-type semiconductor 4.

The color of the light emitted by the LED semiconductor chip 13 is determined by the materials of the N-type semiconductor 4 and the P-type semiconductor 6.

Embodiment Two

Figure 9:
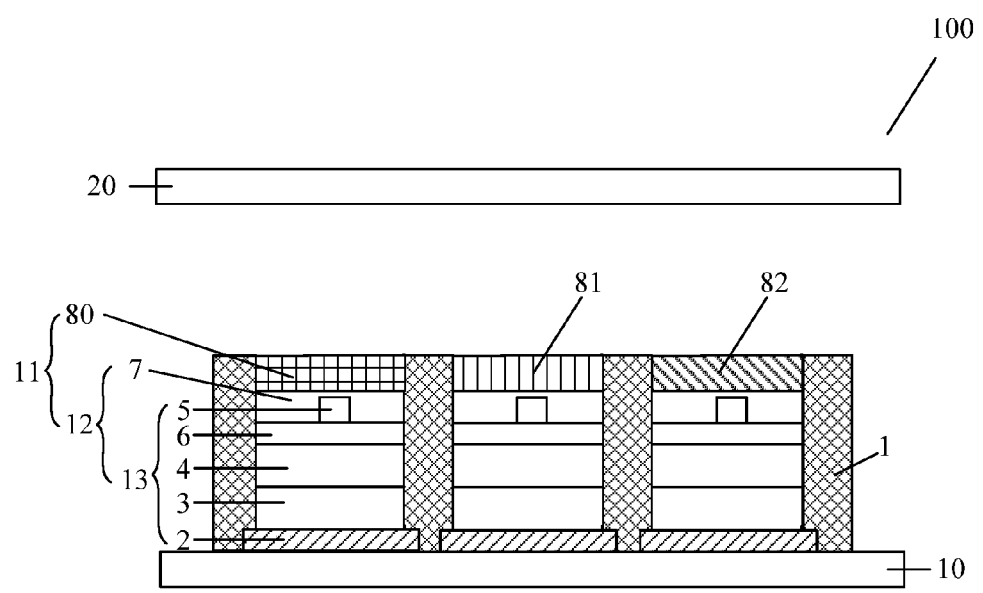
FIG. 9 is a schematic diagram of a display device according to an embodiment of the present disclosure.

The present disclosure provides a display device 100 including the full-color LED display panel of embodiment one, and the display device 100 further includes, as shown in FIG. 9, an encapsulation substrate 20. The thickness of the display device is reduced, the production costs are reduced, and the defect rate of the products are reduced.

Embodiment Three

FIG. 2-FIG. 8 are schematic diagrams showing processes of a manufacturing a full-color LED display panel according to embodiments of the present disclosure. As shown in FIG. 2-FIG. 8, a method of manufacturing a full-color LED display panel includes the following steps.

A substrate 10 is provided.

LED units 12 of a plurality of sub-pixel units 11 are formed on the substrate 10 simultaneously. The LED unit 12 includes an LED semiconductor chip 13 emitting light of a specific color. The LED semiconductor chips 13 of the plurality of sub-pixel units 11 are homochromatic LED semiconductor chips emitting light of a same color.

A filter layer of the plurality of sub-pixel units 11 is formed on the substrate 10. In each sub-pixel unit 11, the filter layer transmits light of a specific color. The filter layer is located in a position corresponding to the LED semiconductor chip 13. The filter layer is located on a side of the LED semiconductor chip 13 that emits light.

Because the LED semiconductor chips of the sub-pixel units are homochromatic LED semiconductor chips that emit light of the same color, through the above steps, all LED semiconductor chips may be formed at the same time, such that the processing cycle is shortened, the production costs are reduced, and the defect rate of products is reduced. In addition, because homochromatic LED semiconductor chips have the same drivers and sizes, the cell thickness of the display panel and the production costs are reduced. In addition, by applying filter layers transmitting light of different colors, the multi-color sub-pixel units are generated to achieve full-color display.

The LED semiconductor chip 13 is a light-emitting unit of the LED unit 12. The filter layer may be an epoxy resin layer containing a primary color material, but not limited in that.

In a specific embodiment, the light emitted by the LED units 12 of a plurality of sub-pixel units 11 may all be white light. In order to achieve color display, the filter layers may include a red filter layer 80, a green filter layer 81, and a blue filter layer 82. Specifically, the blue LED semiconductor chip 13 and yellow phosphors may cooperate to achieve a white LED unit 12. In the present embodiment, the yellow phosphors may be doped into transparent epoxy resin, so as to provide a carrier for the yellow phosphors for the convenience of processing. Thus, each LED unit 12 may also include an epoxy resin layer 7 containing phosphors. And the epoxy resin layers containing phosphors of a plurality of LED units 12 may be formed at the same time to simplify the processing. The epoxy resin layer 7 containing phosphors is formed by the following steps specifically.

A phosphor-containing epoxy resin layer is formed on top of the substrate 10 by a spin coating process;

A mask plate is used to expose and develop the epoxy resin layer containing phosphors, so as to form a pattern of the epoxy resin layer 7 containing phosphors. The epoxy resin layer 7 containing phosphors is located between the corresponding LED semiconductor chip 13 and the filter layer.

In an embodiment, the LED unit 12 is packaged by the following method.

A plurality of sub-pixel regions of different colors are separated by forming opaque pixel separating parts 1 on the substrate 10. The sub-pixel units 11 are located in sub-pixel regions of corresponding colors. The pixel separating parts 1 may be pixel separating walls.

In a direction that the LED semiconductor chip 13 emits light, a height of the pixel separating part 1 is not less than a height of the filter layer. The LED semiconductor chip 13 is defined to emit light only from the top of the LED unit 12 and passing through the filter layer.

In the above packaging method, the LED unit 12 is packaged by the corresponding pixel separating part 1 and the filter layer. Because the pixel separating part 1 is opaque, the light emitted by the LED semiconductor chip 13 may only be emitted from the top of the LED unit 12 and pass through the filter layer. Thus, the light mix among adjacent LED units 12 may be prevented effectively, and the distances among LED units 12 may be reduced to reduce the volume of LED display panel.

Because the LED semiconductor chips 13 of the plurality sub-pixel units 11 are homochromatic LED semiconductor chips, the LED semiconductor chips 13 of the plurality of sub-pixel units 11 may be formed on the substrate 10 simultaneously by the following steps.

A plurality of first electrodes 2 are formed on the substrate 10.

A base 3 is formed above each first electrode 2.

An N-type semiconductor 4 is formed above each base 3.

A P-type semiconductor 6 is formed above each N-type semiconductor 3.

A second electrode 5 is formed above each P-type semiconductor 6.

The material of the base 3 may be sapphire, silicon carbide, or silicon.

In present embodiment, the manufacturing process of the full-color LED display panel includes, but not limited to, the following steps.

Figure 2:
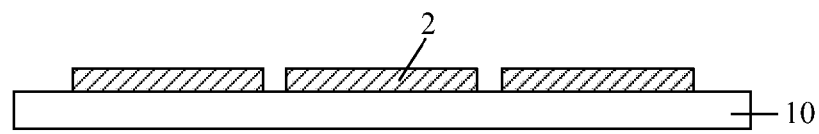
FIG. 2-FIG. 8 are schematic diagrams showing processes of manufacturing a full-color LED display panel according to embodiments of the present disclosure.

In Step S1, as shown in FIG. 2, a layer of metal electrode material may be deposited on the substrate 10 by a magnetron sputtering process, a thermal evaporating process, or other film forming methods. The metal electrode material may be aluminum or other metals. A plurality of first electrodes 2 are formed by a one-time masking process and an etching process.

Figure 3:
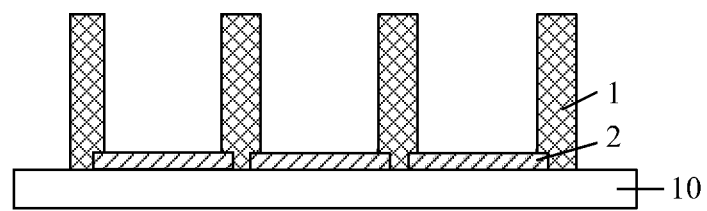

In Step S2, shown in FIG. 3, an opaque film may be deposited on the substrate 10 by a spin-coating process after the completion of Step 1. The opaque pixel separating parts 1 may be formed by one time mask process, and an etching process, so as to form a plurality of separating sub-pixel regions of different colors. The sub-pixel regions may include a red sub-pixel region, a blue sub-pixel region, and a green sub-pixel region. The first electrodes 2 are located in the sub-pixel regions.

Figure 4:
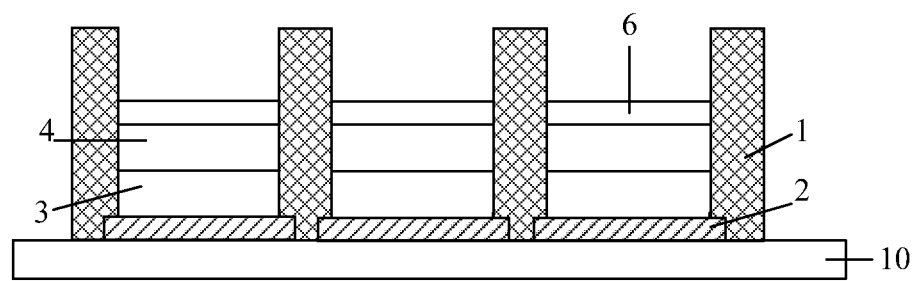

In Step S3, as shown in FIG. 4, a buffer layer, an N-type semiconductor layer, and a P-type semiconductor layer may be deposited on the substrate 10 after the completion of Step S2 by the magnetron sputtering process. Through the one time masking process and the plasma etching process, the base 3, the N-type semiconductor 4, and the P-type semiconductor 6 of the LED semiconductor chip 13 are formed on each first electrode 2 sequentially. The base 3, the N-type semiconductor 4, and the P-type semiconductor 6 of the LED semiconductor chip 13 are all located in the sub-pixel region.

Figure 5:
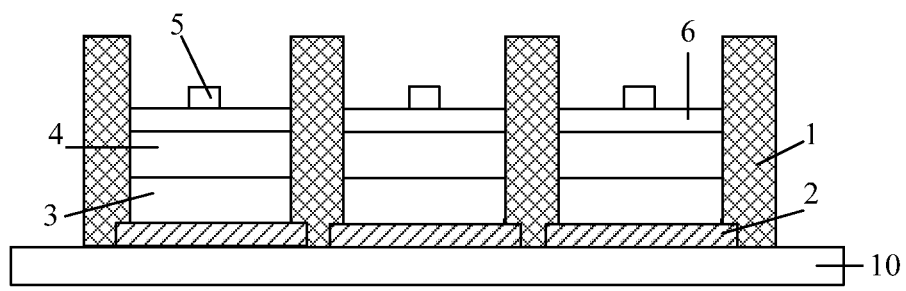

In Step S4, as shown in FIG. 5, a layer of metal electrode material may be deposited on the substrate 10 after the completion of Step S3 by a magnetron sputtering process. The metal electrode material may be aluminum or other metals. A second electrode 5 and corresponding lines of the second electrode 5 are formed by a one-time masking process and an etching process. The second electrode 5 is located within the sub-pixel region.

Through Step S1-S4, the production of the blue LED semiconductor chips 13 and the pixel separating parts 1 may be completed.

Figure 6:
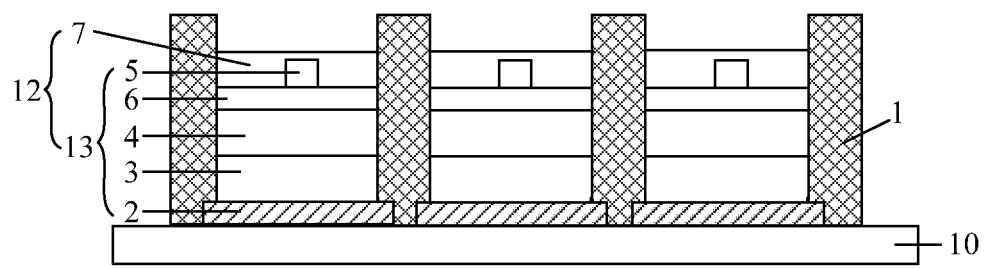

In Step S5, as shown in FIG. 6, an epoxy resin layer containing yellow phosphors may be spin-coated on the substrate 10 after the completion of Step S4. The epoxy resin layer 7 containing yellow phosphors is formed by one time masking process and the etching process. The structure of the white LED unit 12 is formed by then.

Figure 7:
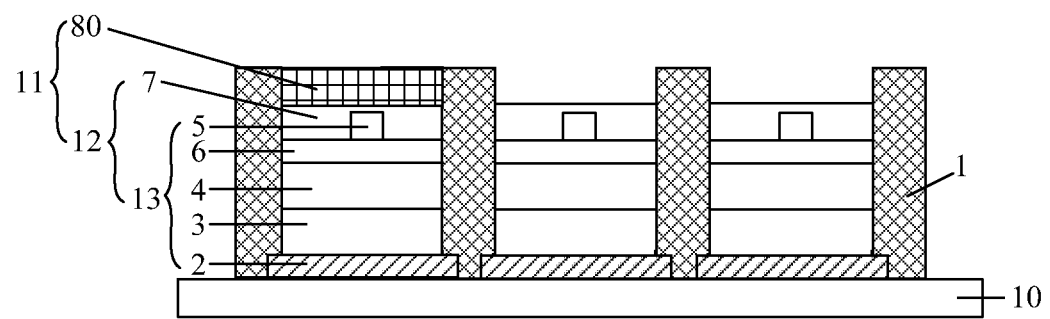

In Step S6, as shown in FIG. 7, a red-material-containing epoxy resin layer may be coated on the substrate 10 after the completion of Step S5. The red filter layer 80 is formed by one time masking process and an etching process. The red filter layer 80 is located within the red sub-pixel region to form the red sub-pixel unit.

Figure 8:
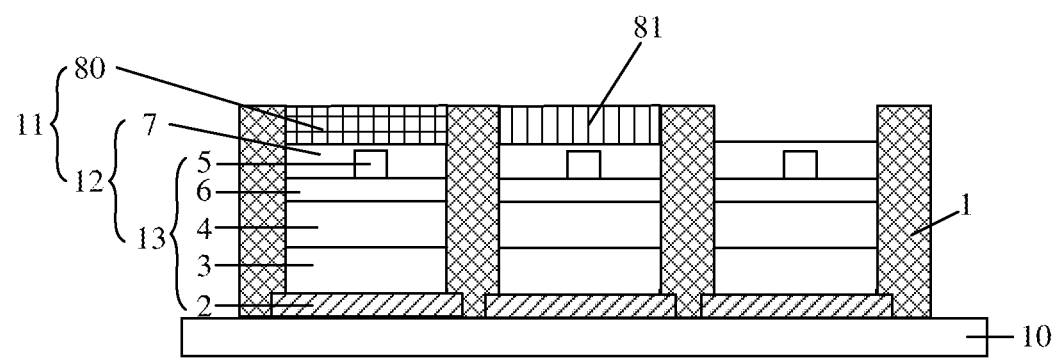

In Step S7, as shown in FIG. 8, a blue-material-containing epoxy resin layer may be coated on the substrate 10 after the completion of Step S6. The blue filter layer 81 is formed by one time masking process and an etching process. The blue filter layer 81 is located within the blue sub-pixel region to form the blue sub-pixel unit.

In Step S8, as shown in FIG. 1, a green-material-containing epoxy resin layer may be coated on the substrate 10 after the 7 completion of Step S6. The green filter layer 82 is formed by one time masking process and an etching process. The green filter layer 82 is located within the green sub-pixel region to form the green sub-pixel unit.

Through Step S1-S8, the production of full-color LED display panel may be completed.

The above are merely the preferred embodiments of the present invention, and the present invention is not limited thereto. Obviously, a person skilled in the art may make further modifications and alterations without departing from the spirit and essence of the present invention, and these modifications and alternations shall also fall within the scope defined by the attached claims.

What is claimed is:

1. A full-color Light Emitting Diode (LED) display panel, comprising:
    a substrate and a plurality of sub-pixel units distributed on the substrate, wherein each of the plurality of sub-pixel units comprises an LED unit and a filter layer transmitting light of a specific color, wherein the LED unit comprises an LED semiconductor chip emitting light of a specific color;
    opaque pixel separating parts, configured to separate a plurality of sub-pixel regions of different colors, wherein the plurality of sub-pixel units are located in sub-pixel regions of corresponding colors;
    wherein the LED semiconductor chip corresponding to each sub-pixel unit of the plurality of sub-pixel units is a homochromatic LED semiconductor chip emitting light of a same color;
    wherein in each sub-pixel unit, a position of the filter layer corresponds to a position of the LED semiconductor chip, and the filter layer is located on a side of the LED semiconductor chip that emits light; and
    wherein in a direction perpendicular to a top surface of the substrate, a height of each of the opaque pixel separating parts is not less than a height of the filter layer, wherein the LED semiconductor chip is defined to emit light only from the top of the LED unit to the filter layer.

2. The full-color LED display panel according to claim 1, wherein the opaque pixel separating parts are pixel separating walls.

3. The full-color LED displaying panel according to claim 1, wherein the LED unit further comprises:
    an epoxy resin layer containing phosphors, wherein the epoxy resin layer containing phosphors is located between the LED semiconductor chip and the filter layer.

4. The full-color LED displaying panel according to claim 3, wherein:
    the LED semiconductor chip is a blue LED semiconductor chip, wherein the phosphors are yellow phosphors.

5. The full-color LED displaying panel according to claim 1, wherein the filter layer is an epoxy resin layer containing a primary color material.

6. The full-color LED display panel according to claim 1, wherein the LED semiconductor chip comprises:
    a first electrode formed on the substrate;
    a base formed above the first electrode;
    an N-type semiconductor formed above the base;
    a P-type semiconductor formed above the N-type semiconductor; and
    a second electrode formed above the P-type semiconductor.

7. A display device, comprising a full-color display panel according to claim 1.

8. The display device according to claim 7, wherein the opaque pixel separating parts are pixel separating walls.

9. The display device according to claim 7, wherein the LED unit further comprises:
an epoxy resin layer containing phosphors, wherein the epoxy resin layer containing phosphors is located between the LED semiconductor chip and the filter layer.

10. The display device according to claim 9, wherein:
the LED semiconductor chip is a blue LED semiconductor chip, wherein the phosphors are yellow phosphors.

11. The display device according to claim 7, wherein the filter layer is an epoxy resin layer containing a primary color material.

12. The display device according to claim 7, wherein the LED semiconductor chip comprises:
a first electrode formed on the substrate;
a base formed above the first electrode;
an N-type semiconductor formed above the base;
a P-type semiconductor formed above the N-type semiconductor; and
a second electrode formed above the P-type semiconductor.

13. A method of manufacturing a full-color LED display panel, comprising:
providing a substrate;
forming opaque pixel separating parts on the substrate, wherein the pixel separating parts separate a plurality of sub-pixel regions of different colors, wherein the sub-pixel units are located in sub-pixel regions of corresponding colors;
forming LED units of a plurality of sub-pixel units on the substrate simultaneously, wherein each of the LED units comprises an LED semiconductor chip emitting light of a specific color, wherein the LED semiconductor chip corresponding to each sub-pixel unit of the plurality of sub-pixel units is a homochromatic LED semiconductor chip emitting light of a same color; and
forming a filter layer of each of the plurality of sub-pixel units on the substrate, wherein in each sub-pixel unit, the filter layer transmits light of a specific color, wherein the filter layer is located in a position corresponding to a position of the LED semiconductor chip, and wherein the filter layer is located on a side of the LED semiconductor chip that emits light;
wherein in a direction perpendicular to a top surface of the substrate, a height of each of the opaque pixel separating parts is not less than a height of the filter layer, wherein the LED semiconductor chip is defined to emit light only from the top of the LED unit to the filter layer.

14. The method of manufacturing a full-color display panel according to claim 13, wherein the opaque pixel separating parts are pixel separating walls.

15. The method of manufacturing a full-color display panel according to claim 13, wherein the forming of LED units of a plurality of sub-pixel units on the substrate simultaneously further comprises:
forming an epoxy resin layer containing phosphors on the substrate, wherein the epoxy resin layer containing phosphors is located between the LED semiconductor chip and the filter layer.

16. The method of manufacturing a full-color display panel according to claim 13, wherein the forming of LED units of a plurality of sub-pixel units on the substrate simultaneously comprises:
forming a plurality of first electrodes on the substrate;
forming a base above each first electrode;
forming an N-type semiconductor above each base;
forming a P-type semiconductor above each N-type semiconductor; and
forming a second electrode above each P-type semiconductor.

* * * * *